(12) United States Patent
Foong et al.

(10) Patent No.: US 10,466,300 B2
(45) Date of Patent: Nov. 5, 2019

(54) HIGH PRECISION VERTICAL MOTION KELVIN CONTACT ASSEMBLY

(71) Applicant: JF MICROTECHNOLOGY SDN. BHD., Petaling Jaya, Selangor (MY)

(72) Inventors: Wei Kuong Foong, Petaling Jaya (MY); Kok Sing Goh, Petaling Jaya (MY); Shamal Mundiyath, Petaling Jaya (MY); Eng Kiat Lee, Petaling Jaya (MY); Mei Chen Chin, Petaling Jaya (MY)

(73) Assignee: JF MICROTECHNOLOGY SDN. BHD., Petaling Jaya (MY)

( * ) Notice: Subject to any disclaimer, the term of this patent is extended or adjusted under 35 U.S.C. 154(b) by 0 days.

(21) Appl. No.: 15/984,023

(22) Filed: May 18, 2018

(65) Prior Publication Data

US 2018/0335473 A1    Nov. 22, 2018

(30) Foreign Application Priority Data

May 18, 2017    (MY) .......................... PI 2017701803

(51) Int. Cl.
*G01R 31/28* (2006.01)
*G01R 1/073* (2006.01)
*G01R 1/067* (2006.01)

(52) U.S. Cl.
CPC ..... *G01R 31/2887* (2013.01); *G01R 1/06738* (2013.01); *G01R 1/07314* (2013.01); *G01R 1/07357* (2013.01); *G01R 1/073* (2013.01)

(58) Field of Classification Search
CPC ............ G01R 1/06738; G01R 1/07314; G01R 1/07357
See application file for complete search history.

(56) References Cited

U.S. PATENT DOCUMENTS

| | | | | |
|---|---|---|---|---|
| 2005/0046433 A1* | 3/2005 | Treibergs | ............... | G01R 1/045 324/750.25 |
| 2006/0279301 A1* | 12/2006 | Treibergs | ........... | G01R 1/06722 324/754.05 |
| 2013/0249583 A1* | 9/2013 | Kuong | ................... | G01R 1/067 324/755.04 |

* cited by examiner

*Primary Examiner* — Giovanni Astacio-Oquendo
*Assistant Examiner* — Alvaro E Fortich
(74) *Attorney, Agent, or Firm* — Maschoff Brennan (57) ABSTRACT

A top housing having a back slot and a front slot parallel with each other, and both stacked on top of a row of lower slots, which is perpendicular to the back and front slots. In this way, the juxtaposition of the back and front slots and the row of lower slots forms two rows of virtual rectangular through-openings. The back of these rows receives a row of first contacts extended through them. The front of these rows receives a row of second contacts extended through them. The through-openings thus guide the contacts at a position of the contacts that is very close to where they contact the lead of the DUT. Hence, there is a very high amount of precision and control of the contact tip that contacts the lead of the DUT.

6 Claims, 6 Drawing Sheets

HIGH PRECISION VERTICAL MOTION KELVIN CONTACT ASSEMBLY

FIELD OF INVENTION

The present invention relates to an electrical contact assembly in an integrated circuit testing apparatus, and specifically to one that achieves a high precision vertical motion by limiting horizontal motion of the contact near its contact end.

BACKGROUND OF INVENTION

Kelvin contact testing in integrated circuit (IC) testing apparatuses typically use cantilever type contacts, where the contacts are formed as cantilevers, and part assembly types, where both contacts are assembled over an electrical insulator. With both these types, there is typically large accumulated tolerances, which makes assembly for precision Kelvin difficult.

Furthermore, kelvin contact assemblies that use housings to secure the cantilever contacts are complex and difficult to install. The end result is a long installation time that results in downtime.

Another problem of cantilever contact designs for kelvin testing apparatuses is that they produce wide tolerances that lead to uneven kelvin gaps and over-wiping issues on the device pads, as well as burr collision on the pin tips. Cantilever contact designs also have an issue with pin co-planarity. When cantilever pins are cut to shape, that creates its own tolerance distributions and contributes to unevenness or the so-called piano effect. This is an undesirable output that affects testing negatively.

What is needed in the art is a kelvin contact assembly that overcomes the above disadvantages.

SUMMARY OF INVENTION

The present invention seeks to overcome the aforementioned disadvantages by providing an electrical contact test assembly that achieves a high precision, near vertical motion at the end that contacts the device under test (DUT) by limiting horizontal motion of the contact close to where the contact contacts the DUT.

In a solution for the problem of wide accumulated tolerances, this invention relates to a top housing having a back slot and a front slot parallel with each other, and both stacked on top of a row of lower slots, which is perpendicular to the back and front slots. In this way, the juxtaposition of the back and front slots and the row of lower slots forms two rows of virtual rectangular through-openings. The back of these rows receives a row of first contacts extended through them. The front of these rows receives a row of second contacts extended through them. The through-openings thus guide the contacts at a position of the contacts that is very close to where they contact the lead of the DUT. Hence, there is a very high amount of precision and control of the contact tip that contacts the lead of the DUT.

This invention also relates to an electrical contact assembly for use in a testing apparatus, comprising: a plurality of first contacts, each first contact having a device end; a plurality of second contacts, each said second contact having a device end; and a top housing having a plurality of lower slots arranged in a row, a back slot, and a front slot, said back and front slots parallel with respect to each other, and said lower slots perpendicular to both back and front slots, and said lower slots stacked below said back and front slots, such that two rows of virtual rectangular through-openings are formed by the juxtaposition of the back and front slots and the lower slots, through which virtual rectangular through-openings said first contact device end and second contact device end extend. The back slot is formed between a back wall and a bridge. The front slot is formed between this bridge and a front wall. Hence, this bridge divides the back and front slots. The row of lower slots is formed by a row of walls arranged side by side to each other.

In other words, a back row of the virtual rectangular through-openings is formed by the juxtaposition of the back slot and a rear portion of the row of lower slots, and a front row of the virtual rectangular through-openings is formed by the juxtaposition of the front slot and a front portion of the row of lower slots. The device ends of the row of first contacts extend through the back row of the virtual rectangular through-openings. The device ends of the row of second contacts extend through the front row of the virtual rectangular through-openings. The use of the term "virtual" here merely means that the through-openings look rectangular only when viewed from a top down view. The "rectangular" quality of the through-openings is derived from the criss-crossing of the lower slots against that of the front slot and back slot.

In one preferred embodiment, there is also provided a bottom housing adapted to be joined with the top housing so that the first contacts and second contacts are secured in position. Both the first and second contacts are provided with anchors that allows them to be anchored to the entire housing.

In another preferred embodiment, each of the first and second contacts comprise an upwards curve and a downwards curve next to each other, which forms an "S" shape in a middle portion of each contact. This "S" shape enables the device end of each contact to slide within the rectangular through-opening substantially more easily in a vertical direction.

In yet another preferred embodiment, each first and second contact device end terminates in a tip, said tip protruding out from the rectangular through-opening and having at least one sloped surface such that, during a test, a vertical movement of said device end through the rectangular through-opening causes the sloped surface to slide along a corner of a wall forming said through-opening, and in that way produces a horizontal movement of said tip along a contact pad of a device under test (DUT). In one special case of this preferred embodiment, the sloped surface on the first contact and second contact face each other, and hence the contact tips move away from each other in a horizontal direction while the DUT is lowered and pushing both first and second contacts downwards.

Other objects and advantages will be more fully apparent from the following disclosure and appended claims.

DETAILED DESCRIPTION OF INVENTION

It should be noted that the following detailed description is directed to an electrical contact assembly of an integrated circuit (IC) testing apparatus, and is not limited to any particular size or configuration but in fact a multitude of sizes and configurations within the general scope of the following description.

LIST OF NUMBERED ELEMENTS IN FIGURES

First Contact (10)
First Contact Load End (11)
First Contact Main Body (12)
First Contact Anchor (13)
First Contact Upwards Curve (14)
First Contact Downwards Curve (15)
First Contact Device End (16)
First Contact Protrusion (17)
First Contact Tip (18)
Second Contact (20)
Second Contact Load End (21)
Second Contact Main Body (22)
Second Contact Anchor (23)
Second Contact Upwards Curve (24)
Second Contact Downwards Curve (25)
Second Contact Device End (26)
Second Contact Protrusion (27)
Second Contact Tip (28)
Top Housing (30)
Bridge (32)
Lower Walls (34)
Lower Slots (340)
Back Wall (36)
Back Slot (360)
Front Wall (38)
Front Slot (380)
Bottom Housing (40)
Device Under Test (DUT) (50)
DUT contact pad (52)

Figure 1:
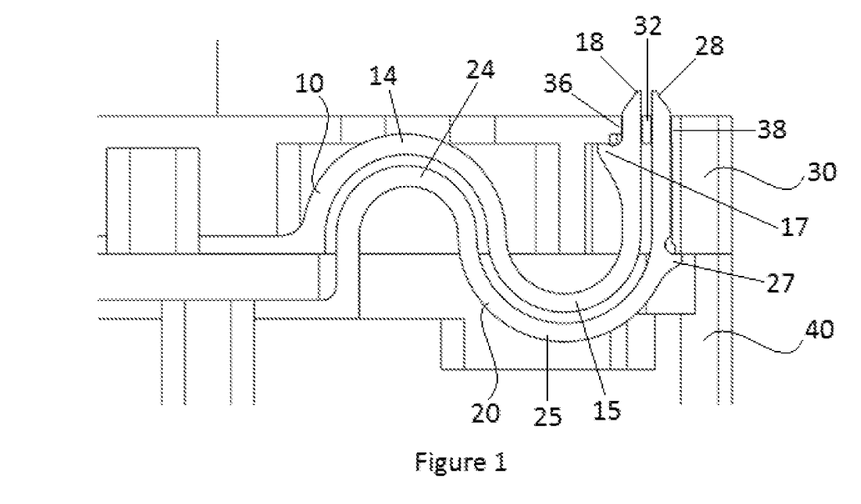
FIG. 1 shows a cross-sectional view of a contact assembly in an uncompressed state in an embodiment of this invention.
Figure 2:
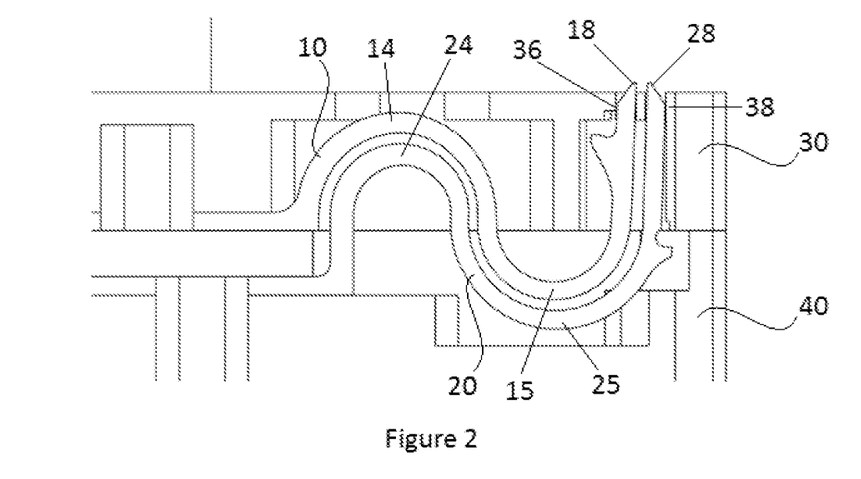
FIG. 2 shows a cross-sectional view of a contact assembly in a compressed state in an embodiment of this invention.
Figure 3:
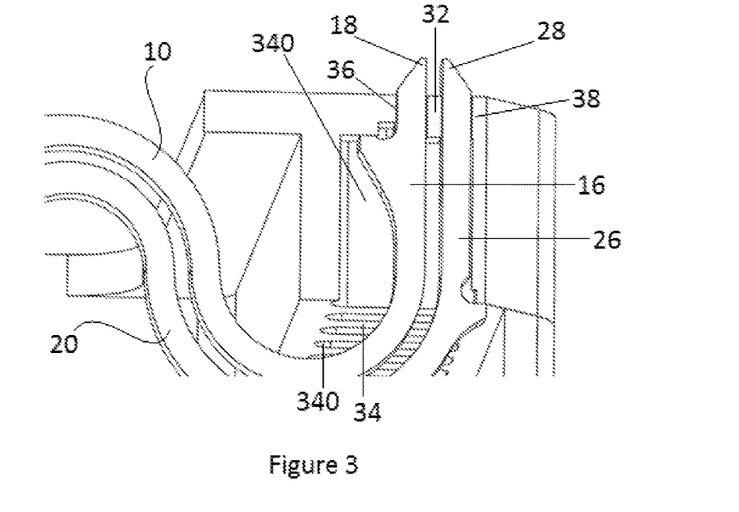
FIG. 3 shows a cross-sectional perpendicular view of a contact assembly in an uncompressed state in an embodiment of this invention.

Referring to FIGS. 1 through 3, there are shown cross-sectional views of a contact assembly in an embodiment of the present invention. A plurality of first contacts (10) and second contacts (20) are secured between a top housing (30) and a bottom housing (40). The plurality of first contacts (10) is arranged in a row, and the plurality of second contacts (20) is arranged in another row. The top housing (30) is machined to have a plurality of lower slots (340) arranged side by side in a row, interspersed between a row of lower walls (32). Each said lower slot (340) runs in a front to back direction. Just above and running perpendicular to the lower slots (340), is a back slot (360) and a front slot (380). The back slot (360) is formed between a back wall (36) and a bridge (32). The front slot (380) is formed between said bridge (32) and a front wall (38). The back slot (360) and front slot (380) are thus parallel to and located next to each other. In this way, and when looking from a top down view, the juxtaposition of the lower slots (340), back slot (360) and front slot (380) form 2 rows of "virtual" rectangular through-openings. The use of the term "virtual" here merely means that the through-openings look rectangular only when viewed from a top down view. The "rectangular" quality of the through-openings is derived from the criss-crossing of the lower slots (340) against that of the front slot (380) and back slot (360). The terms "virtual rectangular through-opening" and "rectangular through-opening" will be used interchangeably and mean the same thing. The back row of these said 2 rows of rectangular through-openings is formed by the juxtaposition of the back slot (360) and a rear portion of the row of lower slots (340). The front row of these said 2 rows of rectangular through-openings is formed by the juxtaposition of the front slot (380) and a front portion of the row of lower slots (340).

The said first contact (10) is composed of a length of electrically conductive material starting at a load end (shown in FIG. 4) that contacts with contact pads on a load board of a testing apparatus, and ending at a short vertical device end (16) with a tip (18) that contacts with contact pads of a device under test (DUT). Before the device end (16), the first contact (10) has an "S" shaped section with an upwards curve (14) and a downwards curve (15). A more detailed description of this first contact (10) will follow with a description of FIG. 4.

The said second contact (20) is likewise composed of a length of electrically conductive material starting at a load end (shown in FIG. 5) that contacts with contact pads on a load board of a testing apparatus, and ending at a short vertical device end (26) with a tip (28) that contacts with contact pads of a device under test (DUT). Before the device end (26), the second contact (20) has an "S" shaped section with an upwards curve (24) and a downwards curve (25). A more detailed description of this second contact (20) will follow with a description of FIG. 5.

Still referring to FIGS. 1 through 3, in said row of first contacts, each first contact device end (16) extends through a corresponding rectangular through-opening located at said back row of rectangular through-openings. The said first contact tip (18) protrudes upwards and out of the rectangular through-opening, clearing the top housing (30). In this way, the first contact device end (16) is guided inside a virtual rectangular through-opening formed by the said lower walls (34), back wall (36) and bridge (32). The first contact device end (16) is thus substantially restricted to motion in a vertical direction, thus allowing a very high precision and control of the contact with the DUT contact pad. The said "S" shaped section of the contact assists in allowing the said first contact device end (16) to move more freely in a vertical direction.

Likewise, in said row of second contacts, each second contact device end (26) extends through a corresponding rectangular through-opening located at said front row of rectangular through-openings. The said second contact tip (28) protrudes upwards and out of the rectangular through-opening, clearing the top housing (30). In this way, the second contact device end (26) is guided inside a virtual rectangular through-opening formed by the said lower walls (34), bridge (32) and front wall (38). The second contact device end (26) is thus substantially restricted to motion in a vertical direction, thus allowing a very high precision and control of the contact with the DUT contact pad. The said "S" shaped section of the contact assists in allowing the said second contact device end (26) to move more freely in a vertical direction.

FIGS. 1 and 3 show the contact assembly in an uncompressed state, whereby a DUT has not been lowered onto the said contact tips (18, 28). A first contact protrusion (17) on the first contact (10) prevents the first contact device end (16) from extending too far upwards by acting as a stopper against an inner surface of the top housing (30). Likewise, a second contact protrusion (27) on the second contact (20) prevents the second contact device end (26) from extending too far upwards by acting as a stopper against an inner surface of the top housing (30). The first contact protrusion (17) and second contact protrusion (27) also play an important role during assembly of the contact assembly of this invention. During assembly, the first contact protrusion (17) and second contact protrusion (27) keep the row of first contacts (10) and row of second contacts (20) co-planar, which means that all the contact tips (18, 28) in each row are the same height with all the other contact tips in the same row.

Figure 4:
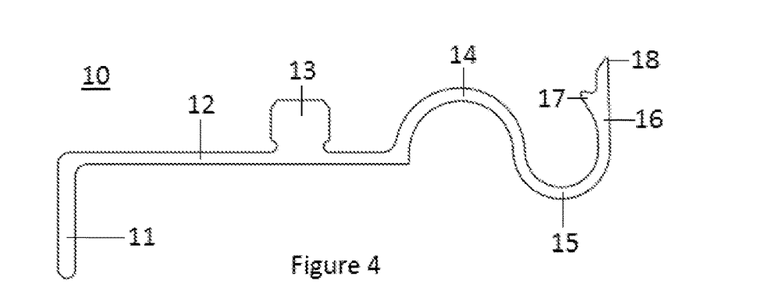
FIG. 4 shows a side view of a first contact in an embodiment of this invention.

FIG. 4 shows a side view of the first contact (10). As mentioned above, this first contact (10) is composed of a length of electrically conductive material. At one end is a vertical load end (11) that contacts with contact pads on a load board of a testing apparatus, which then joins to a horizontal main body (12), an upwards curve (14) and a downwards curve (15) forming an "S" shaped section, and then to a vertical device end (16) and finally a tip (18) located at the end of the device end (16). The tip (18) is adapted to provide contact with contact pads of a device under test (DUT). Along the main body (12) is provided an anchor (13), which is adapted to be secured onto the top housing (30). A first contact protrusion (17) is provided along the length of the device end (16).

Figure 5:
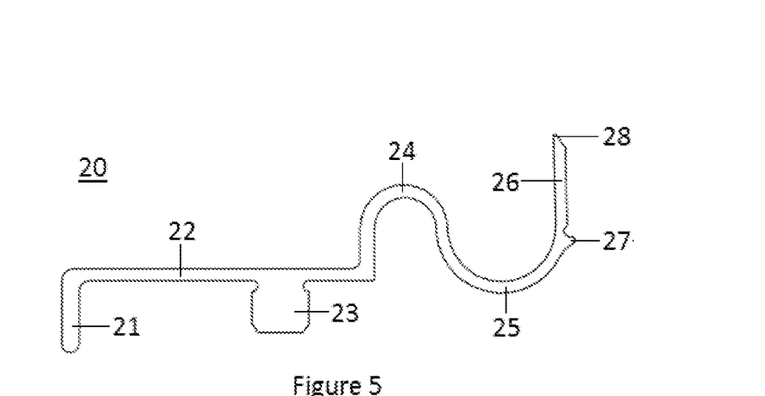
FIG. 5 shows a side view of a second contact in an embodiment of this invention.

FIG. 5 shows a side view of the second contact (20). As mentioned above, this second contact (20) is composed of a length of electrically conductive material. At one end is a vertical load end (21) that contacts with contact pads on a load board of a testing apparatus, which then joins to a horizontal main body (22), an upwards curve (24) and a downwards curve (25) forming an "S" shaped section, and then to a vertical device end (26) and finally a tip (28) located at the end of the device end (26). The tip (28) is adapted to provide contact with contact pads of a device under test (DUT). Along the main body (22) is provided an anchor (23), which is adapted to be secured onto the bottom housing (40). A second contact protrusion (27) is provided along the length of the device end (26).

Figure 6:
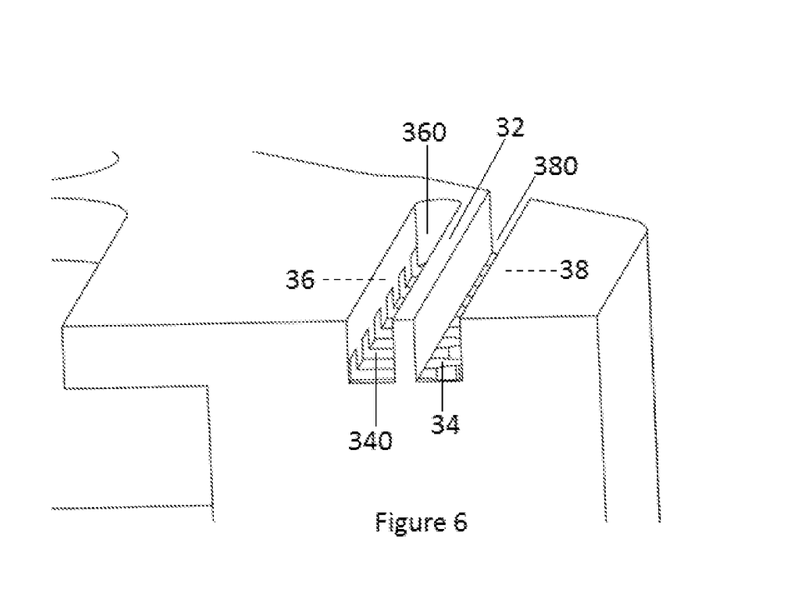
FIG. 6 shows a cross-sectional perpendicular view of a top housing without contacts assembled in an embodiment of this invention.
Figure 7:
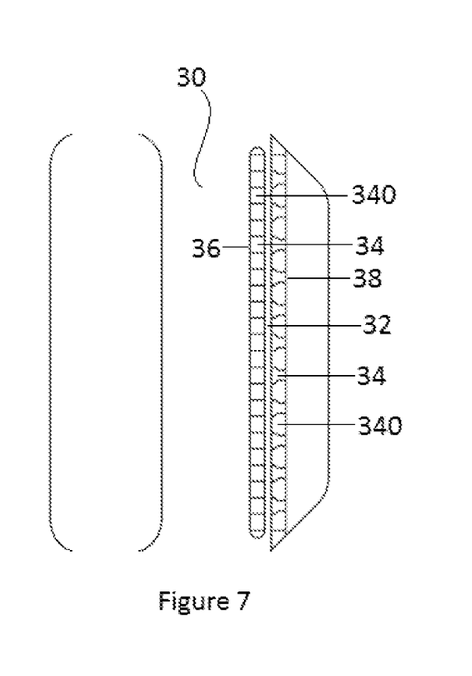
FIG. 7 shows a top view of a top housing without contacts assembled in an embodiment of this invention.
Figure 8:
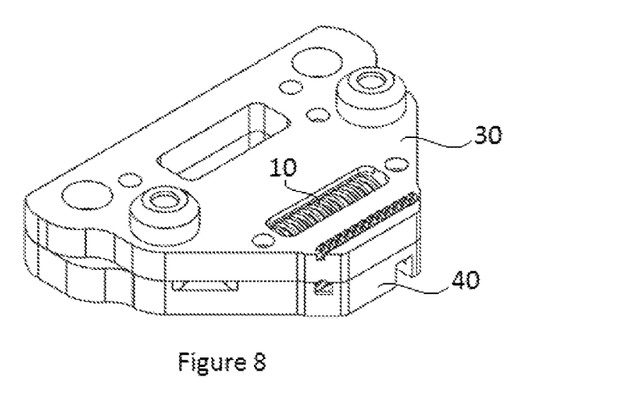
FIG. 8 shows a perpendicular view of a contact assembly in an embodiment of this invention.
Figure 9:
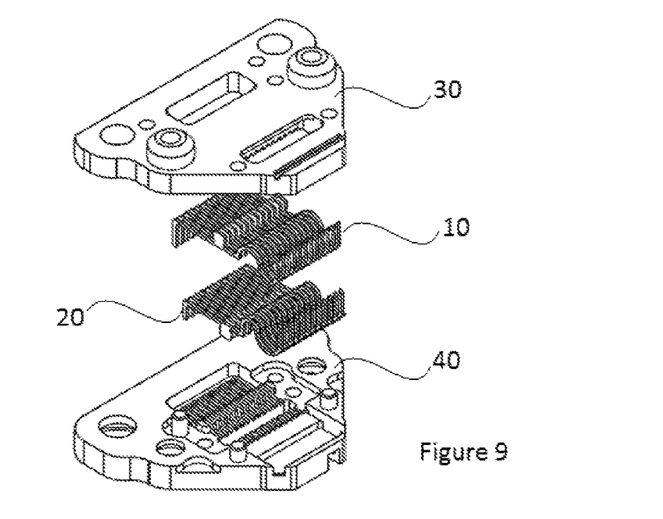
FIG. 9 shows an exploded perpendicular view of a contact assembly in an embodiment of this invention.
Figure 10:
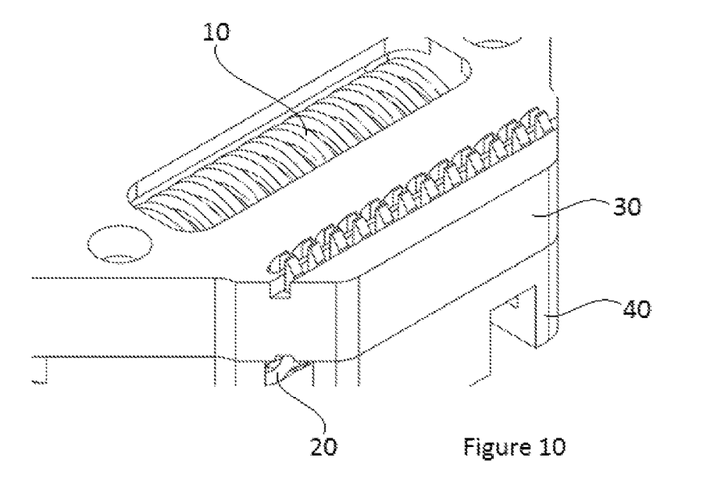
FIG. 10 shows a perpendicular view of a contact assembly in an embodiment of this invention.
Figure 11:
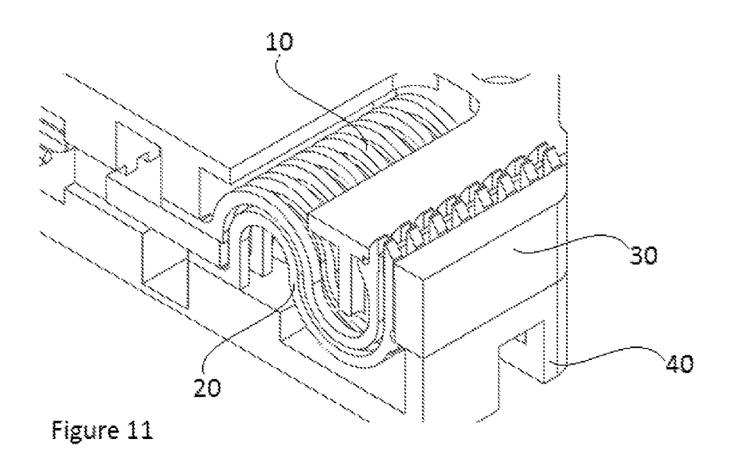
FIG. 11 shows a cross-sectional perpendicular view of a contact assembly in an embodiment of this invention.

FIGS. 6 and 7 show views of the top housing (30) without the first (10) and second (20) contacts installed. These views clearly show how the back slot (360) is formed between the back wall (36) and bridge (32), and the front slot (380) is formed between the bridge (32) and front wall (38). It can be seen and how both the back slot (360) and front slot (380) are stacked above the lower slots (340) and lower walls (34). In FIG. 7, which is a top view, it can then be seen how the juxtaposition of the back slot (360), front slot (380) and lower slots (340) create the said 2 rows of "virtual" rectangular through-openings, through which the contact device ends (not shown in these figures) are extended.

FIGS. 8, 9, 10 and 11 show different views of the contact assembly of the present invention. There can be seen a first contact (10) and a second contact (20) secured between a top housing (30) and a bottom housing (40).

Figure 12:
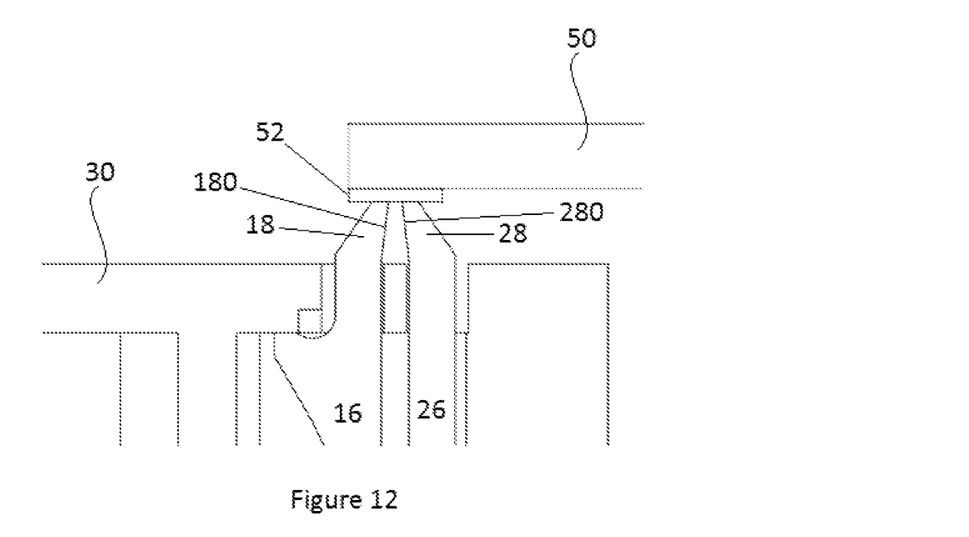
FIG. 12 shows a side cross-sectional view of a contact assembly with a sloped contact tip in an uncompressed state in an embodiment of this invention.
Figure 13:
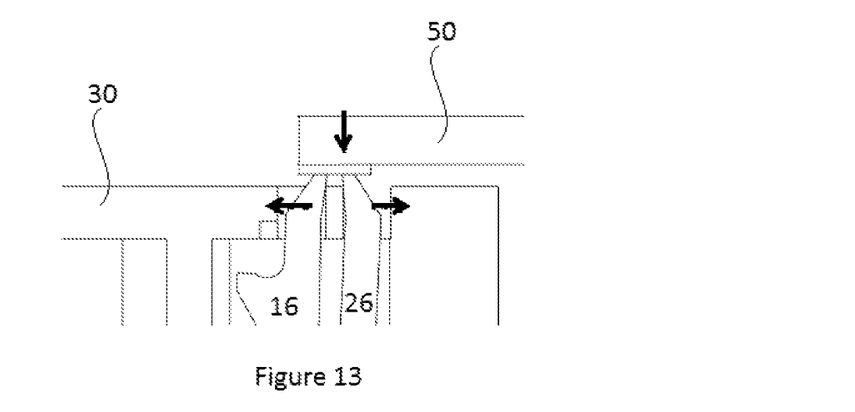
FIG. 13 shows a side cross-sectional view of a contact assembly with a sloped contact tip in a compressed state in an embodiment of this invention.

FIGS. 12 and 13 show an alternative embodiment of the present invention in which one or both of the contact tips (18, 28) are provided with a sloped surface (180, 280) on one of its sides in order to create a controlled horizontal "wiping" motion of the contact tip (18, 28) against a contact pad (52) of a DUT (50). The sloped surface is designed so that it overhangs the top housing (30) when the contact assembly is in an uncompressed state. Thus, when a DUT (50) is lowered onto the contact assembly, and the contact device ends (16, 26) are pushed downwards and further into said rectangular through-openings, the sloped surface (180, 280) causes the contact tips (18, 28) to move in a horizontal direction. The amount of horizontal movement can be controlled by the magnitude of the slope used on the sloped surface (180, 280).

While several particularly preferred embodiments of the present invention have been described and illustrated, it should now be apparent to those skilled in the art that various changes and modifications can be made without departing from the scope of the invention. Accordingly, the following claims are intended to embrace such changes, modifications, and areas of application that are within the scope of this invention.

The invention claimed is:

1. An electrical contact assembly for use in a testing apparatus, comprising:
    a plurality of first contacts, each of said plurality of first contacts having a first contact device end;
    a plurality of second contacts, each of said plurality of second contacts having a second contact device end; and
    a top housing having a plurality of lower slots arranged in a row, a back slot, and a front slot, said back and front slots parallel with respect to each other, and said lower slots perpendicular to both back and front slots, and said lower slots stacked below said back and front slots, such that two rows of virtual rectangular through-openings are formed by the juxtaposition of the back and front slots and the lower slots, through which virtual rectangular through-openings said first contact device end and second contact device end extend.

2. An electrical contact assembly for use in a testing apparatus according to claim 1 further comprising a bottom housing adapted to be joined with said top housing so that the said first contacts and second contacts are secured in position.

3. An electrical contact assembly for use in a testing apparatus according to claim 1, wherein the each of said plurality of first contacts comprises an upwards curve and a downwards curve next to each other, which forms an "S" shape in a middle portion of each of said plurality of first contacts, thus enabling said first contact device end to slide within said rectangular through-opening substantially more vertically.

4. An electrical contact assembly for use in a testing apparatus according to claim 1, wherein the each of said plurality of second contacts comprises an upwards curve and a downwards curve next to each other, which forms an "S" shape in a middle portion of each of said plurality of second contacts, thus enabling said second contact device end to slide within said rectangular through-opening substantially more vertically.

5. An electrical contact assembly for use in a testing apparatus according to claim 1 wherein each said first contact device end terminates in a tip, said tip protruding out from said rectangular through-opening and said tip having at least one sloped surface such that, during a test, a vertical movement of said first contact device end through said rectangular through-opening causes said sloped surface to slide along a corner of a wall forming said through-opening and in that way produces a horizontal movement of said tip along a contact pad of a device under test.

6. An electrical contact assembly for use in a testing apparatus according to claim 1 wherein each said second contact device end terminates in a tip, said tip protruding out from said rectangular through-opening and said tip having at least one sloped surface such that, during a test, a vertical movement of said second contact device end through said rectangular through-opening causes said sloped surface to slide along a corner of a wall forming said through-opening and in that way produces a horizontal movement of said tip along a contact pad of a device under test.

* * * * *